United States Patent [19]
Kim et al.

[11] Patent Number: 6,104,050
[45] Date of Patent: *Aug. 15, 2000

[54] METHODS FOR FABRICATING INTEGRATED CIRCUIT DEVICES INCLUDING ETCHING BARRIER LAYERS AND RELATED STRUCTURES

[75] Inventors: Do-hyung Kim, Seoul; Joo-young Lee; Young-so Park, both of Kyungki-do, all of Rep. of Korea

[73] Assignee: Samsung Electronics Co., LTD, Rep. of Korea

[ * ] Notice: This patent issued on a continued prosecution application filed under 37 CFR 1.53(d), and is subject to the twenty year patent term provisions of 35 U.S.C. 154(a)(2).

[21] Appl. No.: 09/002,766

[22] Filed: Jan. 5, 1998

Related U.S. Application Data

[62] Division of application No. 08/687,055, Aug. 7, 1996, Pat. No. 5,763,323.

[30] Foreign Application Priority Data

Sep. 19, 1995 [KR] Rep. of Korea ............ 96-30678

[51] Int. Cl.[7] .................................. H01L 27/108
[52] U.S. Cl. .................. 257/296; 257/905; 438/634; 438/740; 438/970
[58] Field of Search ................. 257/296, 905, 257/907, 908, 68, 71, 300; 438/634, 740, 970

[56] References Cited

U.S. PATENT DOCUMENTS

| | | | |
|---|---|---|---|
| 5,275,972 | 1/1994 | Ogawa et al. | 438/624 |
| 5,292,684 | 3/1994 | Chung et al. | 437/187 |
| 5,391,895 | 2/1995 | Dreifus | 257/77 |
| 5,429,991 | 7/1995 | Iwasaki et al. | 437/192 |
| 5,565,372 | 10/1996 | Kim | 437/195 |
| 5,567,989 | 10/1996 | Sim | 257/774 |
| 5,578,847 | 11/1996 | Aoki et al. | 257/296 |
| 5,589,413 | 12/1996 | Sung et al. | 437/192 |
| 5,604,365 | 2/1997 | Kajigaya et al. | 257/296 |
| 5,795,810 | 8/1998 | Houston | 438/404 |
| 5,893,728 | 4/1999 | Hidaka | 438/155 |

FOREIGN PATENT DOCUMENTS 1-162349 6/1989 Japan.

*Primary Examiner*—Tom Thomas
*Assistant Examiner*—Ori Nadav
*Attorney, Agent, or Firm*—Myers Bigel Sibley & Sajovec

[57] ABSTRACT

An integrated circuit device includes a substrate, an insulating layer on the substrate, and a plurality of parallel conductive lines on the insulating layer. An etch barrier is on each of the parallel conductive lines wherein each of the etch barriers comprises a layer of silicon nitride on a respective conductive line and wherein each of the etch barriers further comprises a layer of silicon on the silicon nitride layer. In addition, the device includes a plurality of conductive vias through the insulating layer providing electrical connection to respective surface portions of the substrate, wherein each of the conductive vias is provided in the insulating layer between the etch barriers.

11 Claims, 13 Drawing Sheets

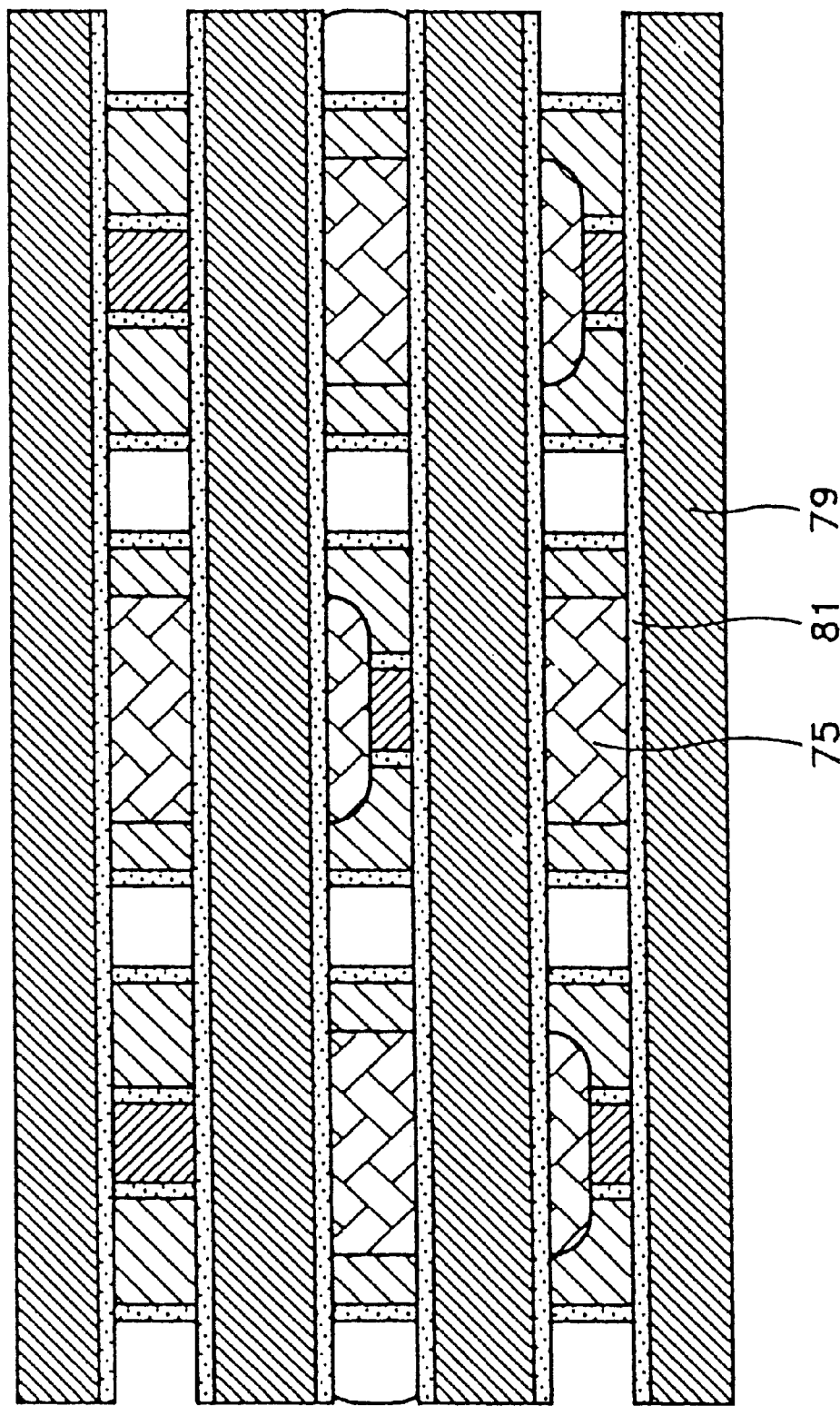

METHODS FOR FABRICATING INTEGRATED CIRCUIT DEVICES INCLUDING ETCHING BARRIER LAYERS AND RELATED STRUCTURES

This is a patent application Divisional of prior application U.S. Ser. No.:08/687,055; filed Aug. 7, 1996, now U.S. Pat. No. 5,763,323.

FIELD OF THE INVENTION

The present invention relates to the field of electronic devices and more particularly to the field of integrated circuit electronic devices.

BACKGROUND OF THE INVENTION

Integrated circuit memory devices are being developed with increasingly higher levels of integration in order to-increase the memory capacity of these devices. Accordingly, the size of each unit memory cell within an integrated circuit memory device is reduced. The thicknesses of the layers used to form the memory cells, however, are not necessarily reduced in proportion to the reduction of the size of the memory cell. The vertical structure of these smaller memory cells may thus become more complicated as the ratio of layer thicknesses to cell size increases.

In particular, dynamic random access memories (DRAM) are typically developed with levels of integration which are higher than that of other integrated circuit memory devices. Furthermore, the capacitor of a DRAM memory cell is usually formed after forming the bit-lines of the DRAM to increase the effective area of the capacitor. Accordingly, an electrical connection must be provided from the capacitor to the source region of a transistor on the substrate, and this electrical connection is typically formed after forming the gate-lines, the bit-lines, and various insulating layers. Accordingly, with highly integrated dynamic random access memories, this electrical connection generally must be provided between bit-lines which are more closely spaced and through layers which have not decreased in thickness at the same rate as the decrease in space between bit-lines.

A plan view of a conventional dynamic random access memory including a buried contact hole is illustrated in FIG. 1. Sectional views of the DRAM of FIG. 1 are illustrated in FIGS. 2 and 3. In particular, FIG. 2 is taken along section line AA' of FIG. 1, and FIG. 3 is taken along section line BB' of FIG. 1.

As shown, each memory cell is formed on a region of the substrate 1 including a source region 5, a drain region 7, and a channel region therebetween. A plurality of gate-lines 3 are formed on the substrate, and each of the gate-lines 3 is located adjacent a channel region. In particular, each gate-line includes an insulating layer adjacent the substrate and a conductive layer on the insulating layer opposite the substrate. Each drain region 7 is electrically connected to a respective bit-line 11 through an auxiliary conductive layer pattern 9. An insulating film 13 is formed over the substrate 1 and the gate-lines 3.

A photoresist pattern 15 is formed on the insulating layer 13. This pattern is used as a mask to etch buried contact holes 17 through the insulating layer 13 thus exposing the source regions 5 of the transistors formed in the substrate. The contact hole 17 can then be used to provide electrical connection between the source regions and respective memory cell capacitors.

A plan view of the photoresist pattern 15 used to etch the buried contact holes 17 is illustrated in FIG. 4. In particular, the photoresist pattern includes openings corresponding to the contact holes 17 to be etched. These contact holes must be relatively small and precisely aligned relative to the source regions in order to etch through the insulating layers without exposing the bit-lines 11 or the gate-lines 3.

As the size of the memory cell is reduced, however, the size of the holes in the photoresist pattern 15 must also be reduced. This reduction in the size of the holes in the photoresist pattern may be limited, however, by the photolithography process used to pattern the photoresist. Furthermore, the alignment margin for the photoresist pattern decreases as the size of the memory cell is reduced resulting in a greater likelihood of failure due to misalignment. In addition, as the size of the memory cell decreases without corresponding reductions in the thicknesses of the layers, the etching process may become more difficult to perform.

SUMMARY OF THE INVENTION

It is therefore an object of the present invention to provide improved integrated circuit devices and related methods.

It is another object of the present invention to provide methods for fabricating integrated circuit devices with higher tolerance for photolithographic misalignment.

These and other objects are provided according to the present invention by methods of forming integrated circuit devices including the steps of forming an insulating layer on a substrate, and forming a plurality of parallel conductive lines on the insulating layer. An etch barrier is formed on each of the parallel conductive lines, and contact holes are formed between the etch barriers. These contact holes expose portions of the substrate without exposing the plurality of parallel conductive lines. Accordingly, the conductive lines are protected by the respective etch barriers when forming the contact holes between the etch barriers.

More particularly, the step of forming the contact holes includes the steps of forming a patterned mask layer and etching the exposed portions of the insulating layer without exposing the plurality of conductive lines. The patterned mask layer is formed on the insulating layer and the etch barriers, and the patterned mask layer selectively exposes a plurality of parallel strips orthogonal to the plurality of parallel conductive lines. The exposed parallel strips may cross at least one of the etch barriers. Accordingly, the patterned mask layer and the etch barriers together define the contact holes which are etched. This method thus provides increased tolerance for misalignment in the direction of the parallel strips because the sides of the contact holes in this direction are defined by the etch barriers.

The etch barriers can be formed from a layer of silicon nitride on each of the conductive lines, and the etch barriers may further include spacers along the side-walls of the conductive lines. In addition, the etch barriers may include a layer of silicon on the silicon nitride layer. Accordingly, an insulating layer formed from a material such as silicon oxide can be etched selectively with respect to the etch barriers. Each of the spacers can be formed by forming a continuous layer of an etch resisting material such as silicon nitride on the insulating layer and the etch barrier, and anisotropically etching the layer of the etch resisting material. Spacers are thus formed along the side-walls of the parallel conductive lines without requiring the use of photolithography.

The substrate of the integrated circuit device preferably includes a plurality of source and drain regions separated by channel regions, and the step of forming the insulating layer can be preceded by the step of forming a plurality of parallel gate-lines on the substrate. In particular, each of the gate-lines is adjacent at least one of the channel regions, and the gate-lines are orthogonal to the parallel conductive lines. The insulating layer separates the plurality of gate-lines and the substrate from the plurality parallel conductive lines. In addition, each of the conductive lines can be a bit-line, and the step of forming the parallel bit-lines can be preceded by the step of forming an electrical contact through the insulating layer to each of the drain regions so that each of the bit-lines is electrically connected to at least one of the drain regions.

The step of forming the gate-lines can be followed by the step of forming a plurality gate spacers along side-walls of the plurality of gate-lines. The spacers thus provide tolerance from misalignment during the formation of the source contact holes in the direction orthogonal to the mask pattern.

The plurality of parallel conductive lines and the etch barriers can be formed simultaneously. In particular, a continuous layer of a conductive material can be formed on the insulating layer and a continuous layer of an etch resisting material can be formed on the layer of the conductive material. Portions of the etch resisting material and the conductive material can then be selectively removed to form the parallel conductive lines and etch barriers thereon. Accordingly, both the parallel conductive lines and the etch barriers can be formed with a single masking step.

The methods discussed above can thus be used to fabricate an integrated circuit device with increased tolerance for photolithographic misalignment. In particular, contact holes can be provided for memory cell capacitors after the formation of the gate-lines and bit-lines in memory devices with increasingly smaller memory cells. In particular, the etch barrier on the bit-lines increases the tolerance for misalignment when forming the photoresist mask used to form the capacitor contact holes. Accordingly, contact holes with an increased aspect ratio can be fabricated according to the methods of the present invention.

BRIEF DESCRIPTION OF THE DRAWINGS

FIGS. 9A–9G are plan views of a structure at various steps of a method for forming an integrated circuit memory device according to the present invention.

DETAILED DESCRIPTION OF PREFERRED EMBODIMENTS

Figure 1:
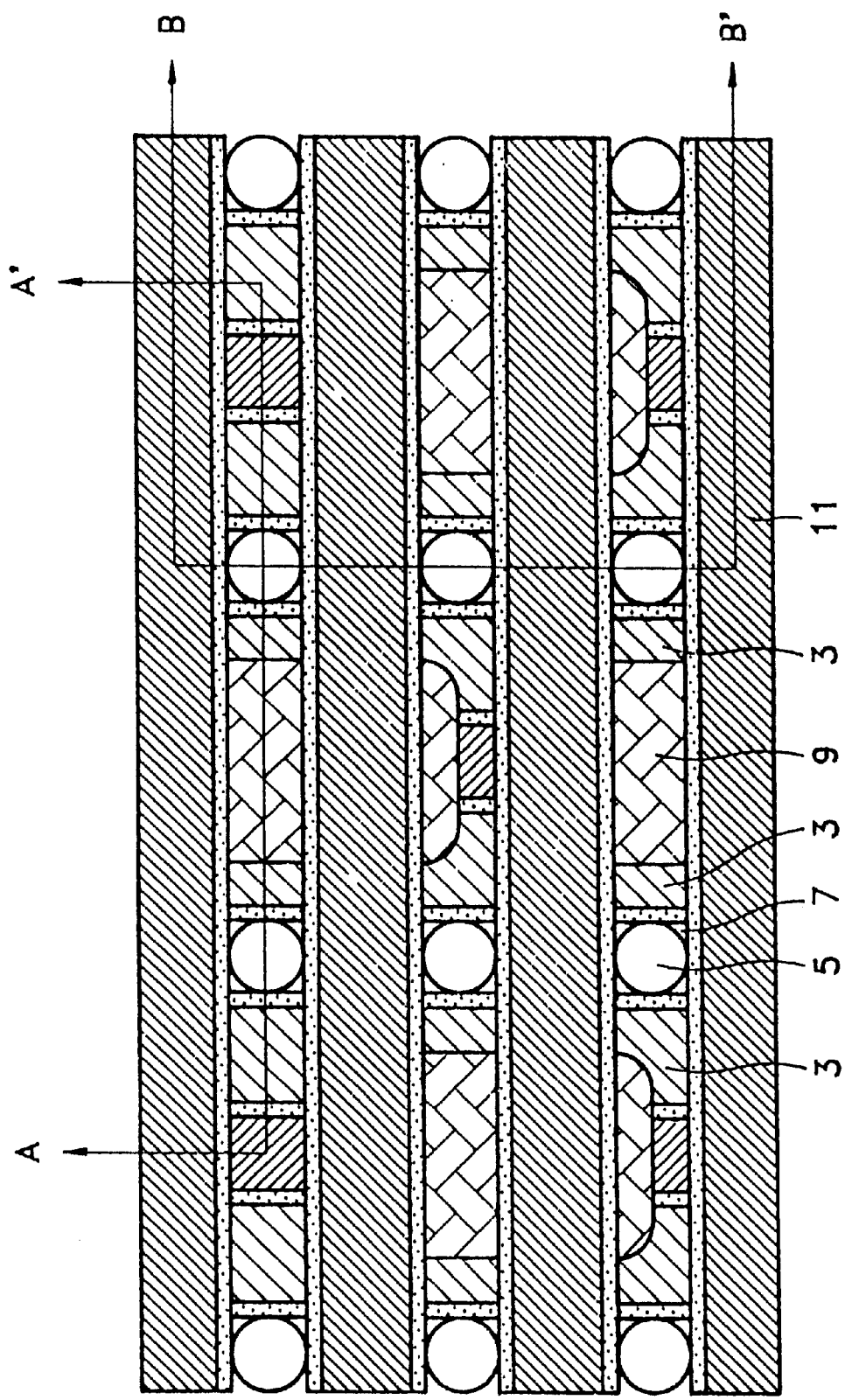
FIG. 1 is a plan view illustrating an integrated circuit memory device including a buried contact hole according to the prior art.
Figure 2:
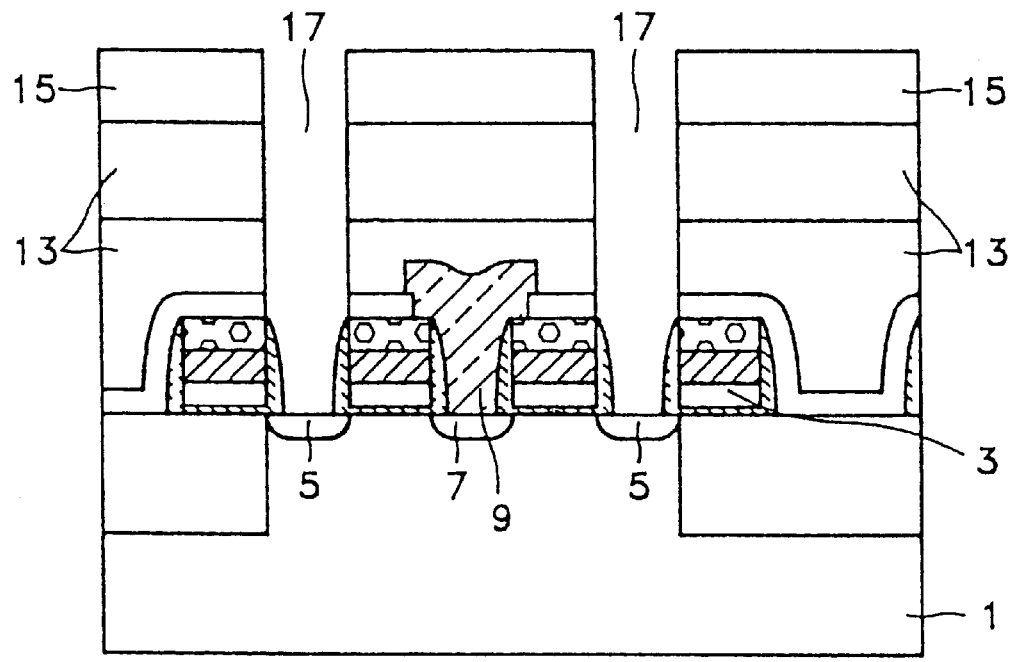
FIG. 2 illustrates a cross-sectional view of an integrated circuit memory device taken along section line AA' of FIG. 1.
Figure 3:
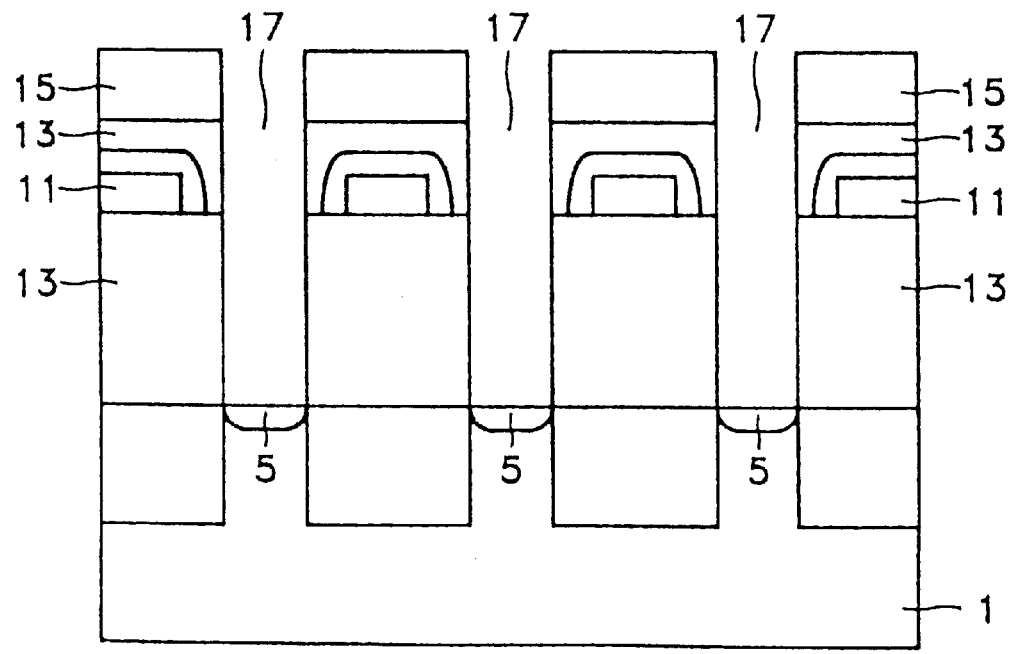
FIG. 3 illustrates a cross-sectional view of an integrated circuit memory device taken along section line BB' of FIG. 1.
Figure 4:
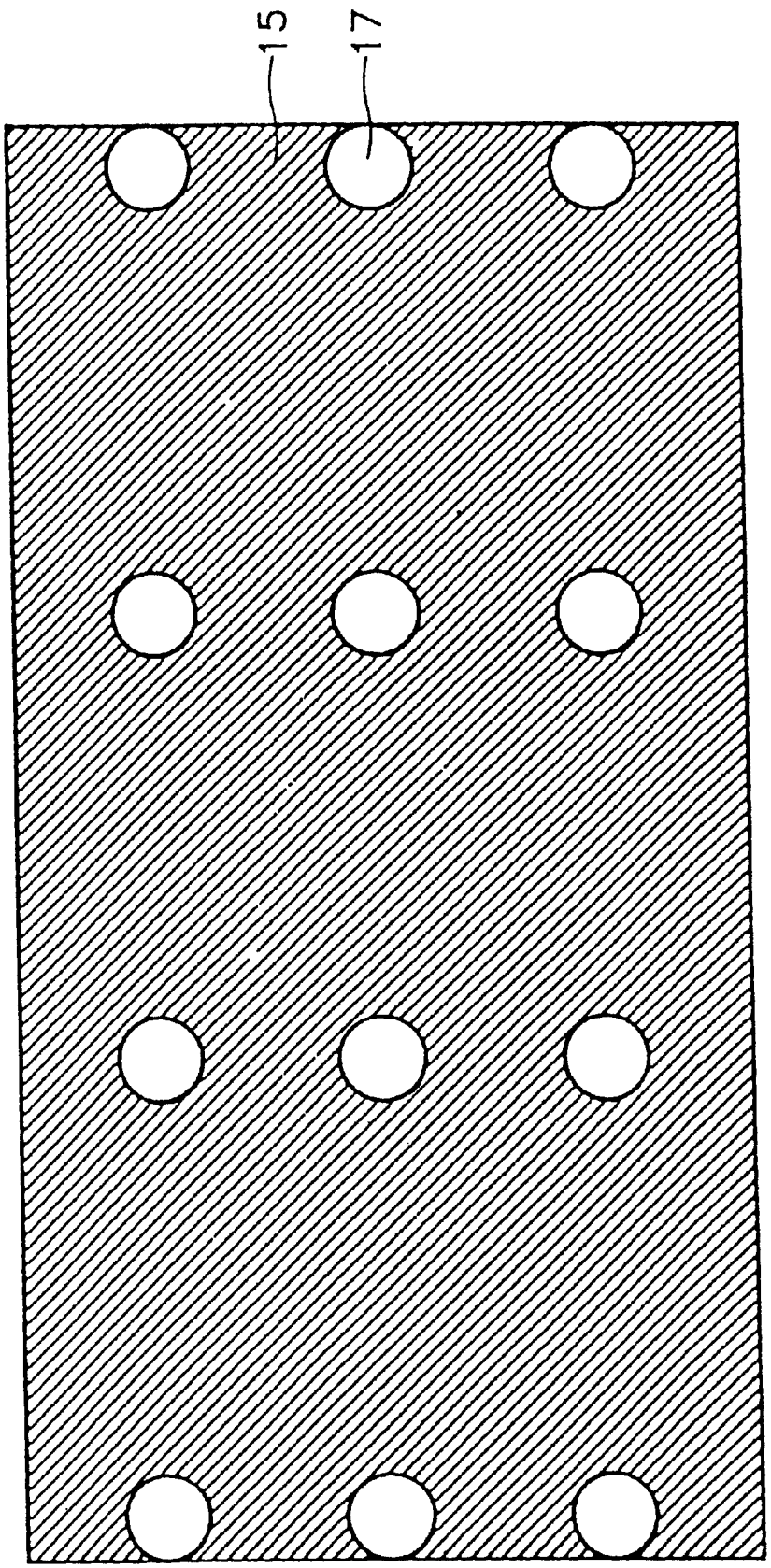
FIG. 4 is a plan view of a photoresist pattern used to form the buried contact holes of the integrated circuit memory device of FIG. 1.

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout.

Figure 5:
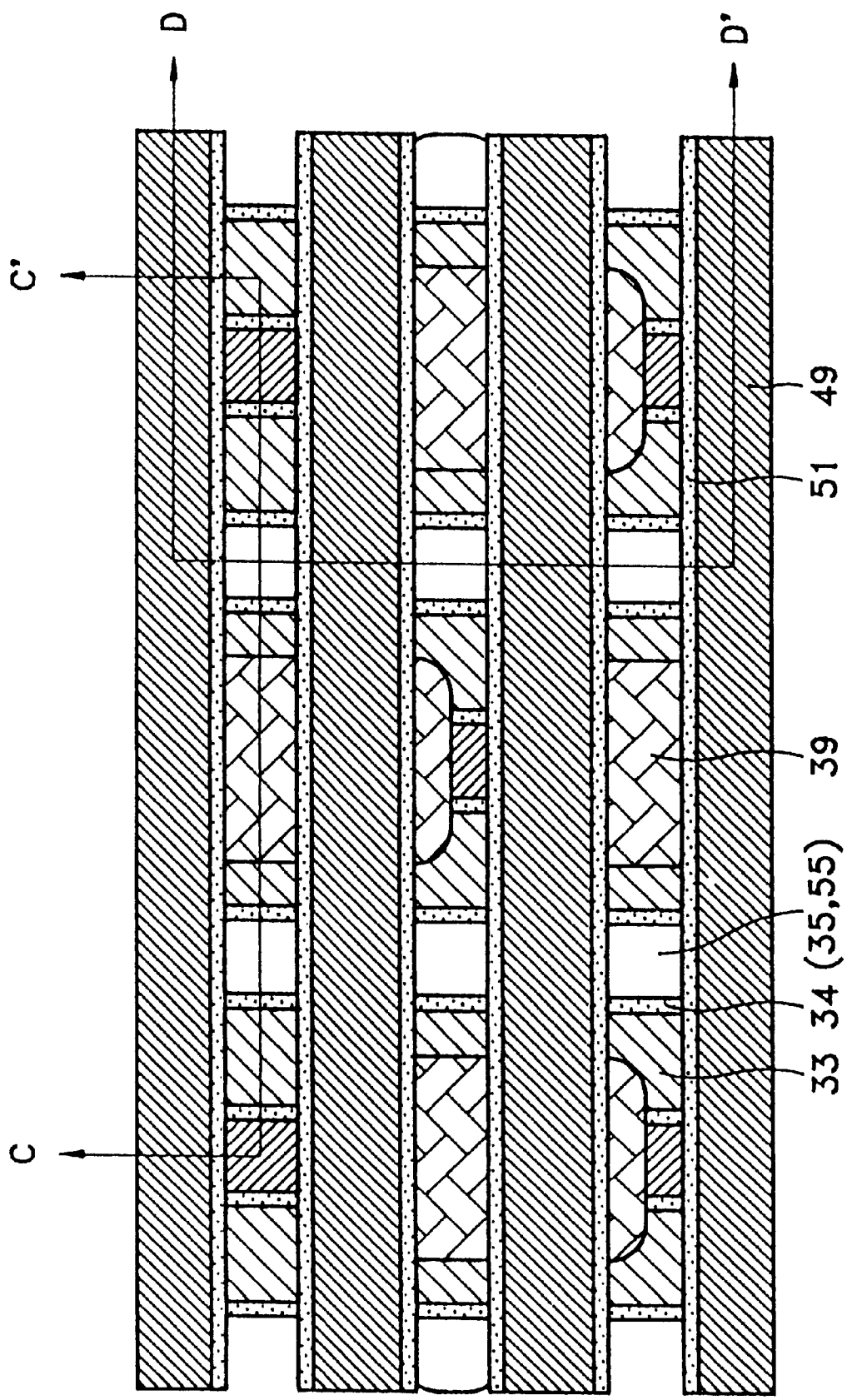
FIG. 5 is a plan view illustrating an integrated circuit memory device having a buried contact hole according to the present invention.
Figure 6:
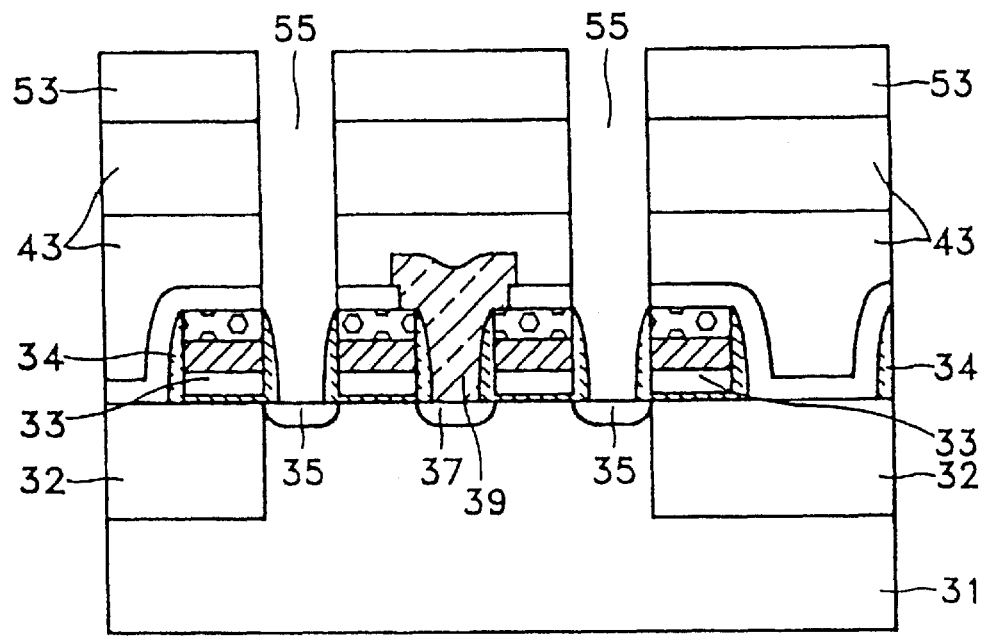
FIG. 6 illustrates a cross-sectional view of an integrated circuit memory device taken along section line CC' of FIG. 5.
Figure 7:
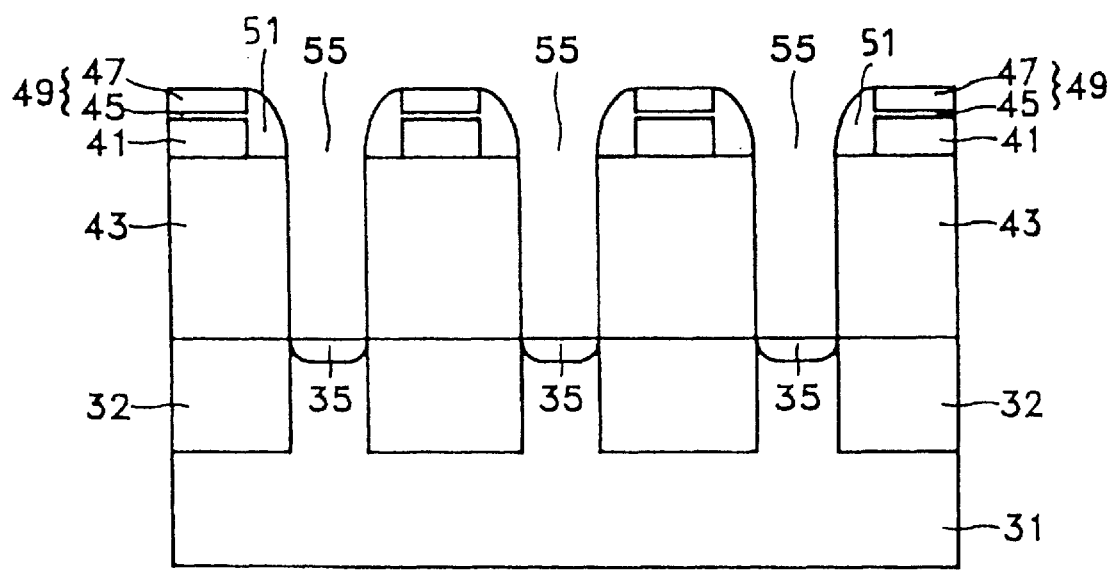
FIG. 7 illustrates a cross-sectional view of an integrated circuit memory device taken along section line DD' of FIG. 5.

FIG. 5 illustrates a plan view of an integrated circuit memory device according to the present invention, while FIGS. 6 and 7 illustrate cross-sectional views of the memory device of FIG. 5 taken along section lines CC' and DD' respectively. An active region of the substrate 31 is defined between non-active regions 32 which can be formed, for example, by a shallow trench isolation method or by a local oxidation of silicon (LOCOS) method. Within this active region, the source regions 35 and the drain region 37 of a transistor are formed. A channel region is defined between the source regions 35 and the drain region 37, and gate-lines 33 are provided adjacent the channel regions. In addition, spacers 34 are provided along the side-walls of the gate-lines 33.

Each of the drain regions 37 is electrically connected to one of a plurality of bit-lines 41 via an auxiliary conductive layer 39 (also known as a landing pad). An insulating layer 43 is formed to cover the surface of a semiconductor substrate 31 and the gate-lines 33. The bit-lines 41 are formed on this insulating layer 43. In addition, an etch barrier 49 is formed on each of the bit-lines 41, and the etch barrier may include a nitride layer 45 made of silicon nitride and a silicon layer 47 made of polycrystalline silicon. A spacer 51 made of silicon nitride is formed along the side-walls of the bit-lines 41, to protect the bit-lines 41 during a following etch. As will be understood by one having skill in the art, the gate-lines 33 are orthogonal with respect to the bit-lines 41, and the gate-lines and bit-lines are separated by the insulating layer 43.

Figure 8:
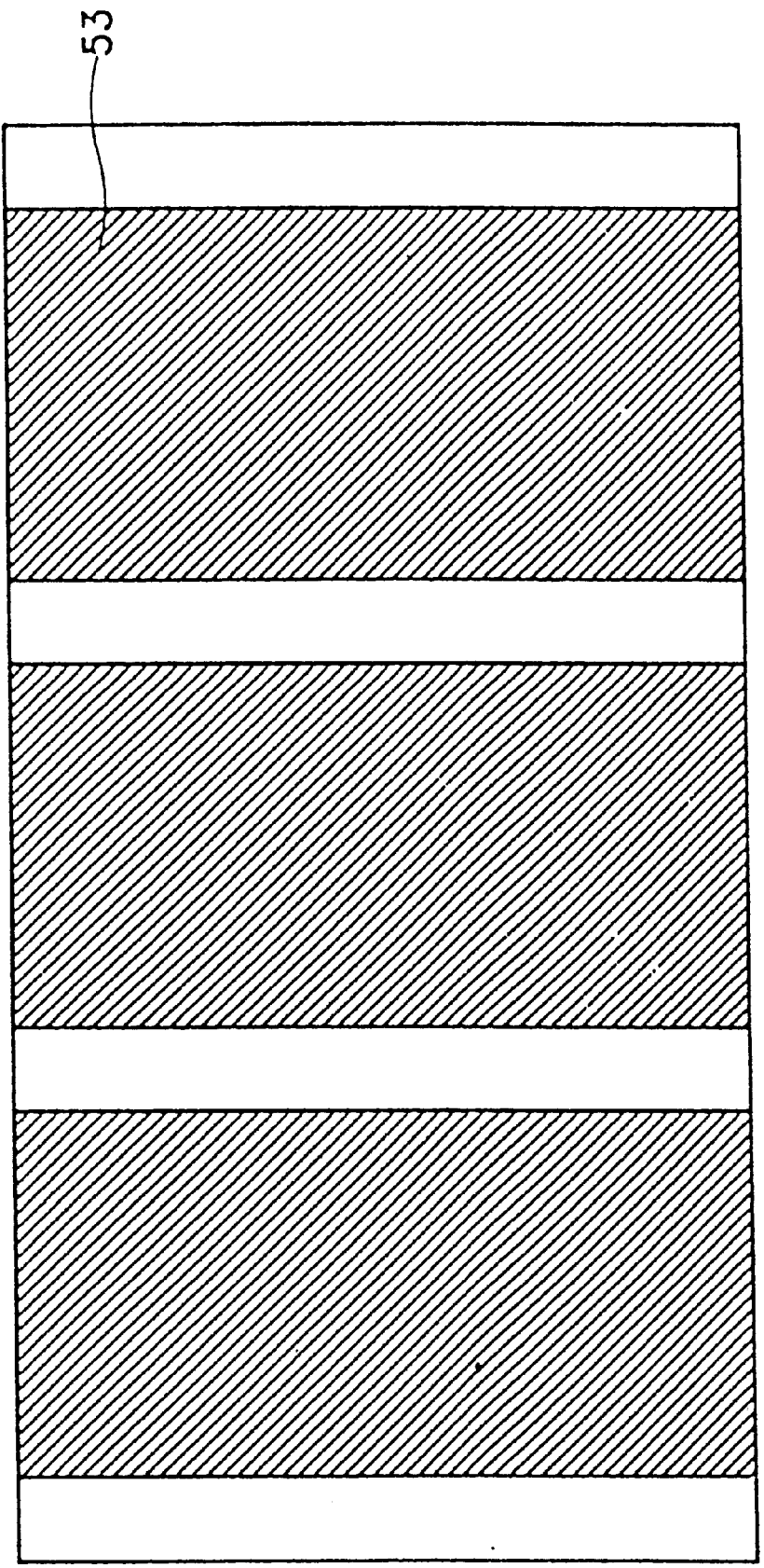
FIG. 8 is a plan view illustrating a photoresist pattern used to form the buried contact holes of the integrated circuit memory device of FIG. 5.

The insulating layer 43 is patterned using a photoresist mask 53. Portions of the insulating layer 43 exposed by the photoresist mask 53 are etched to form buried contact holes 55 thus exposing the source regions 35 of the transistors on the substrate. In particular, the photoresist mask 53 exposes lines along the insulating layer 43 which are orthogonal to the bit-lines 41, as shown in FIG. 8.

In particular, the photoresist mask 53 can leave lines of the insulating layer 43 exposed wherein these exposed lines are orthogonal to the bit-lines 41. Because the bit-lines 41 are protected by the etch barriers 49 and the spacers 51, the bit-lines 41 are not exposed when etching the contact hole 55 which exposes the source regions 35 on the substrate. The etch barriers 49 thus effectively serve as a mask when forming the buried contact holes 55.

Accordingly, the line pattern of the photoresist mask 53 can be more easily aligned with the source regions 35 as the size of the memory cell is reduced. In other words, the line pattern of the present invention can be more easily aligned than the hole pattern of the prior art. In fact, relatively little alignment is required with respect to the side of the contact holes defined by the etch barriers 49 and the spacers 51. In addition, an alignment error at the side of the contact hole adjacent the gate-lines 33 can be partially compensated for by the spacers 34 formed at the side-walls of the gate-lines 33. Accordingly, the alignment margin can be increased thus reducing failures caused by misalignment. Because etchants can be used which selectively etch the silicon oxide of the insulating layer 43 relative to the silicon and silicon nitride layers of the etch barrier 49, the buried contact holes 55 can be etched using the photoresist mask 53 with line patterns as the aspect ratio of the buried contact holes increase.

Figure 9A:
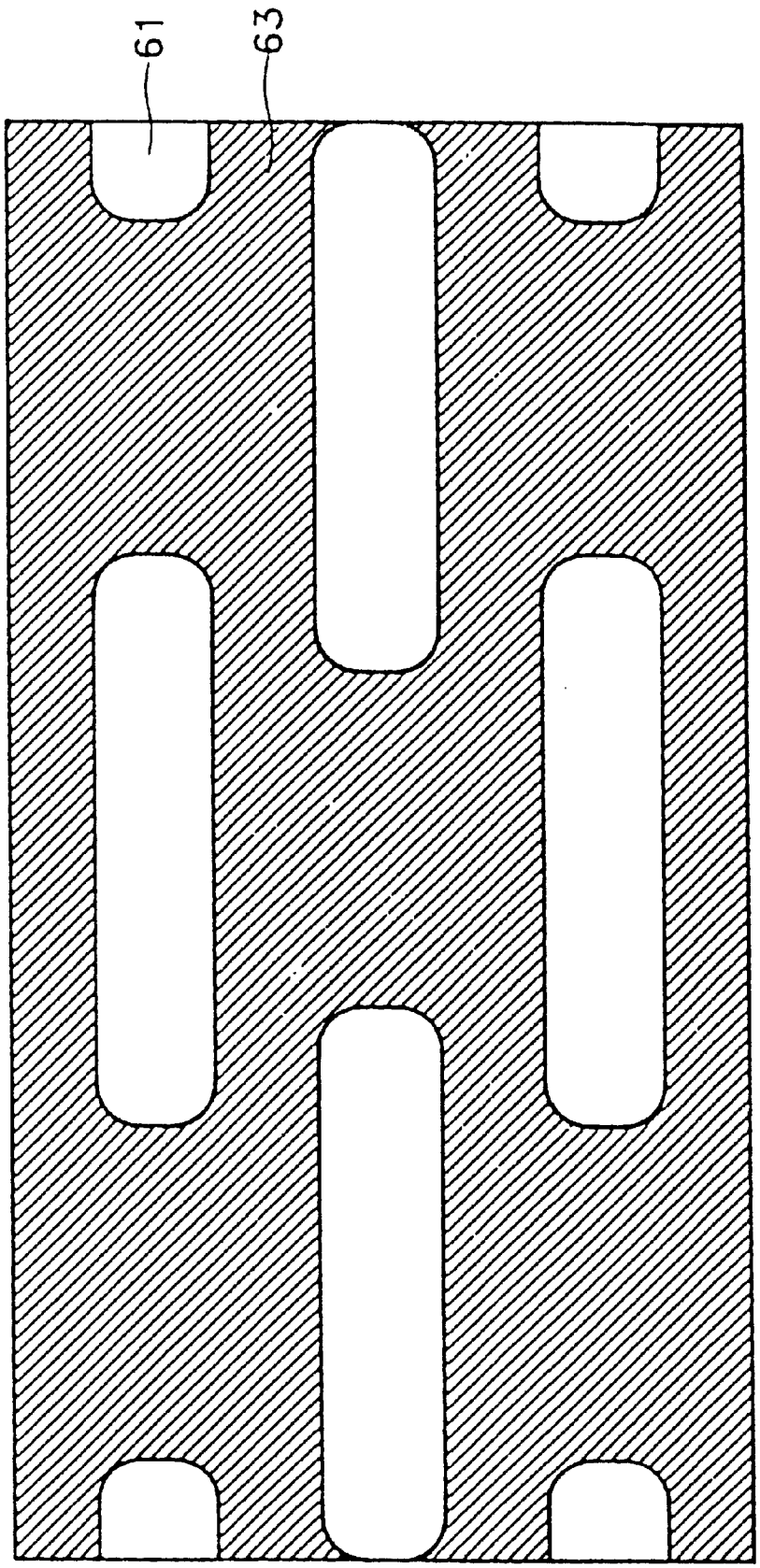

A method for fabricating an integrated circuit memory device according to the present invention is illustrated in FIGS. 9A–9G. FIG. 9A illustrates the step of forming the inactive region 63 defining active regions 61 for the unit memory cells of the integrated circuit memory device. The inactive region 63 can be formed using a shallow trench isolation method.

Figure 9B:
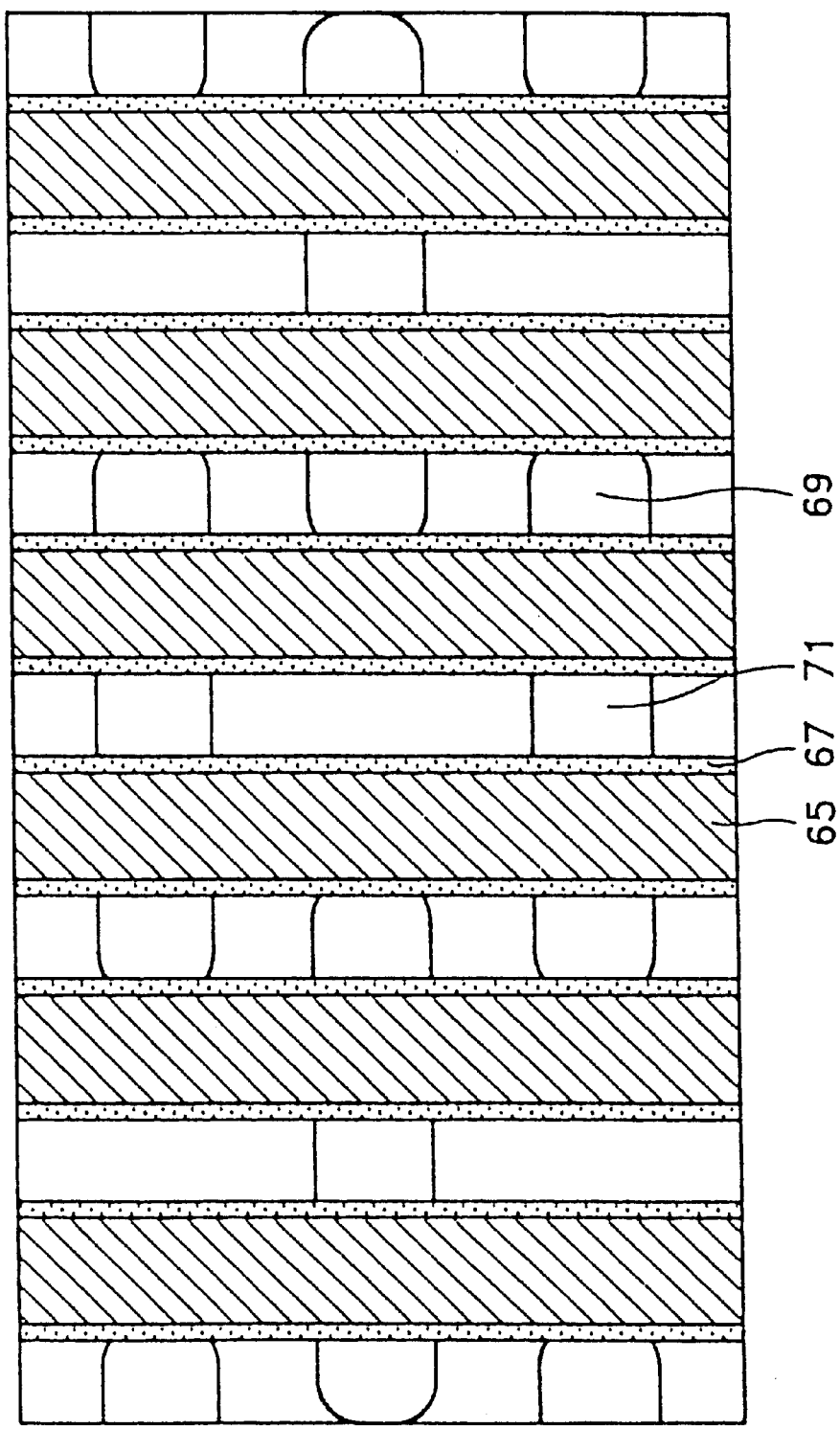

In FIG. 9B, a plurality of gate insulating layers are formed on the substrate wherein each of the gate insulating layers extends across at least one of the active regions 61. A plurality of gate-lines 65 are then formed on the gate insulating layers. As will be understood by one having skill in the art, the term gate-line can be defined so as to include both the gate insulating layer and the conductive gate-line. In addition, spacers 67 are formed along each of the side-walls of the gate-lines 65, and these spacers can be formed, for example, using an anisotropic etching method. Source regions 69 and drain regions 71 are defined within the active regions on opposite sides of the gate-lines 65. A first insulating film is formed across the substrate and the gate-lines 65. In particular, the spacers 67 can be formed from silicon nitride, and the first insulating layer can be formed from silicon oxide.

Figure 9C:
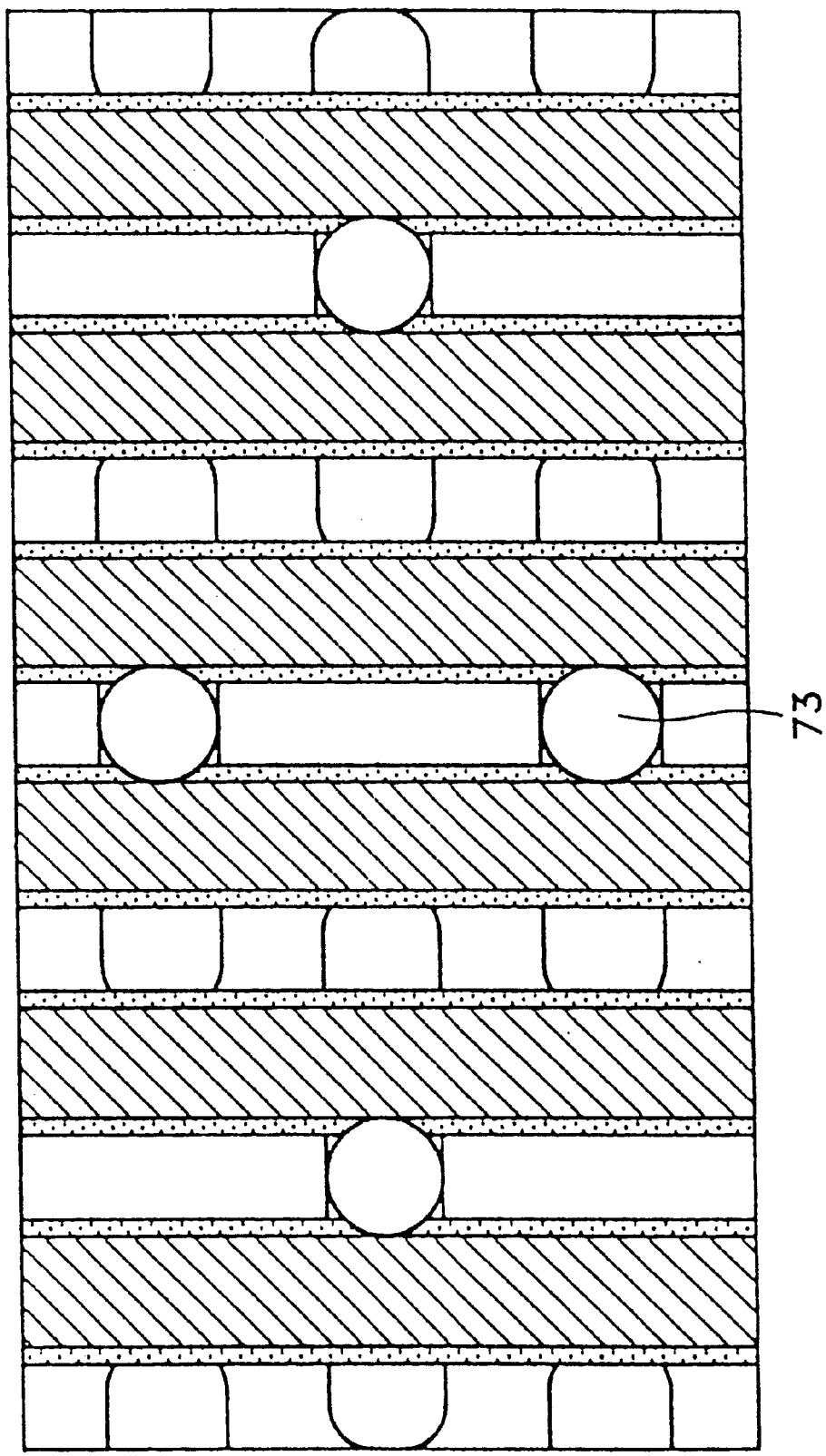
Figure 9D:
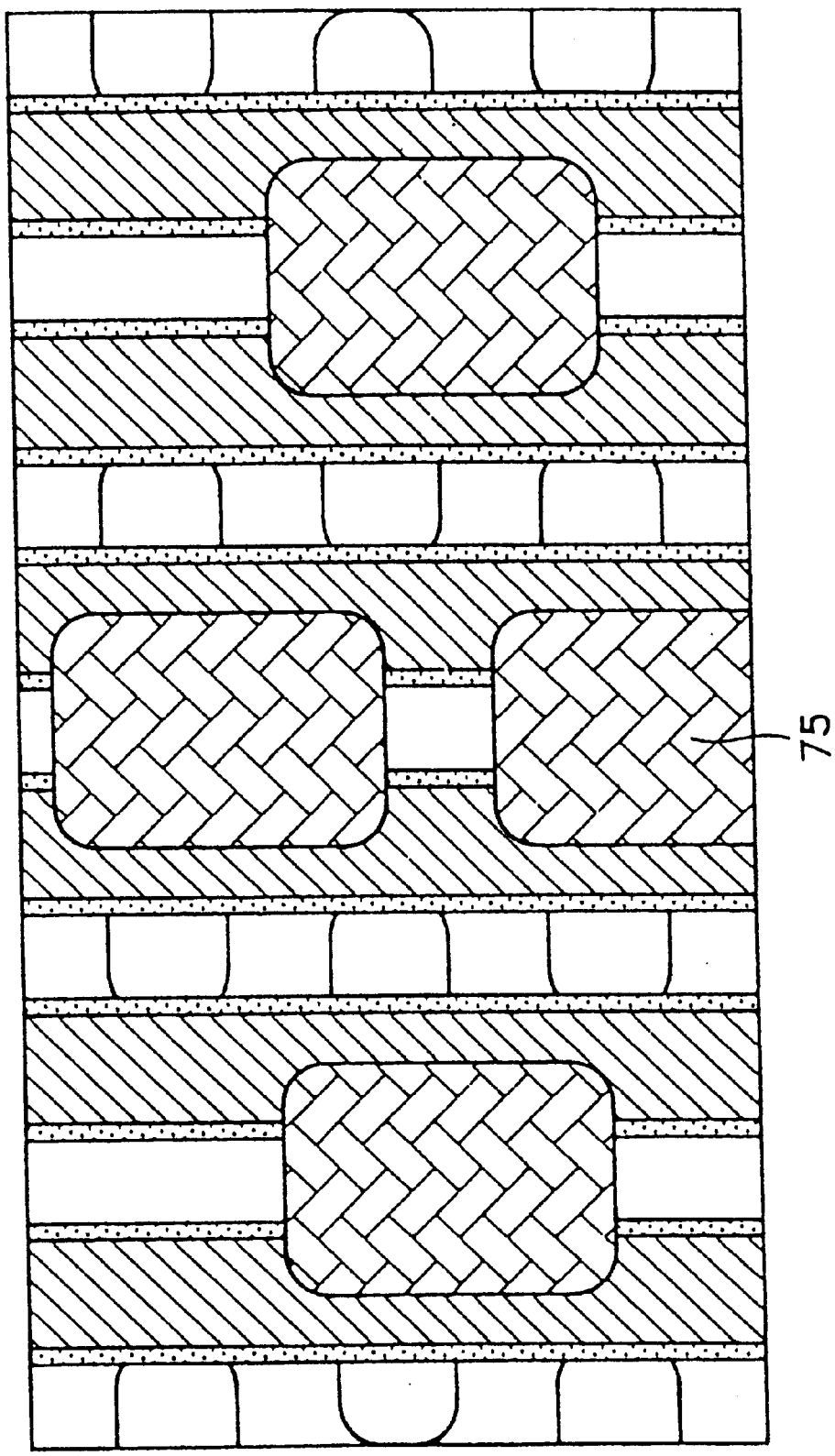

As shown in FIG. 9C, a first plurality of contact holes 73 can be formed in the insulating layer thereby exposing the drain regions 71 of the transistors of the memory cells. A plurality of auxiliary conductive layers 75 are formed on the first insulating layer as shown in FIG. 9D. Each auxiliary conductive layer 75 can be formed of a doped polycrystalline silicon layer, for example, which is formed on the first insulating film to contact a respective drain region 71 of a transistor through a respective contact hole 73 of FIG. 9C. The auxiliary conductive layers 75 can be formed as a continuous layer and then selectively etched to form the individual auxiliary conductive layers. A second insulating film is then formed on the auxiliary conductive layers 75 and the first insulating layer. This second insulating film can also be formed from silicon oxide.

Figure 9E:
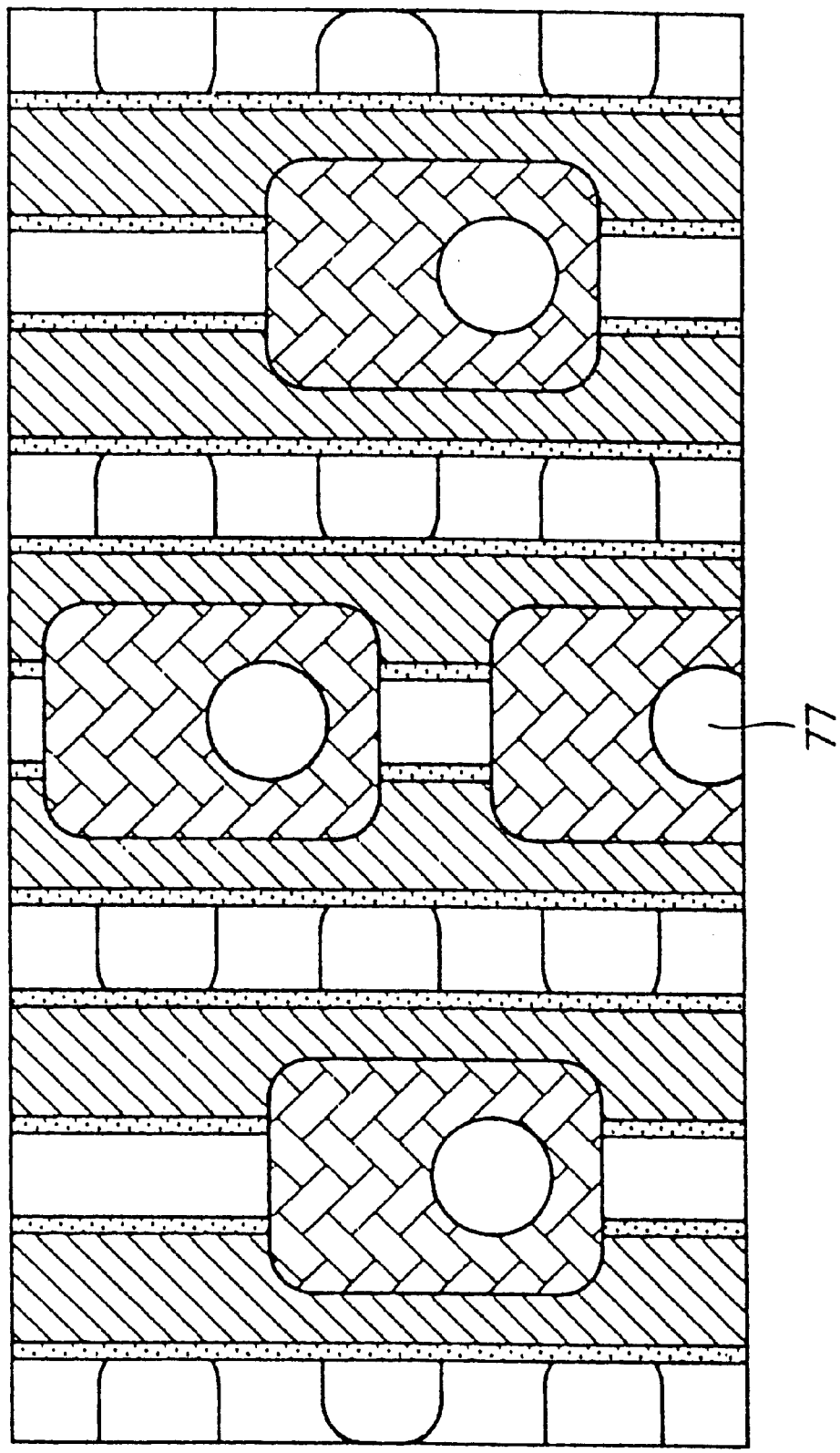

A second plurality of contact holes 77 is formed in the second insulating layer as shown in FIG. 9E. Each of the second plurality of contact holes 77 exposes a respective auxiliary conductive layer 75. A plurality of bit-lines are then formed on the second insulating layer as shown in FIG. 9F. In particular, each bit-line is formed of a conductive material and is electrically connected to at least one auxiliary conductive layer 75 via a respective second contact hole 77. An etch barrier 79 is formed on each of the bit-lines.

The bit-lines and etch barriers can be formed by providing a continuous conductive layer on the second insulating layer and by providing a layer of an etch resisting material on the layer of conductive material. The two layers can then be patterned using conventional photolithography techniques to form the plurality of bit-lines with respective etch barriers thereon. As shown, the bit-lines are oriented orthogonal to the gate-lines 65. The bit-lines can be formed from titanium, titanium nitride, or tungsten, and the etch barriers 79 can be formed from a silicon nitride layer and a silicon layer. The silicon layer can be provided on the silicon nitride layer opposite the bit-line, and the silicon layer can be a polycrystalline silicon layer which may include dopants.

A second plurality of spacers 81 is formed on the side-walls of the bit-lines and the etch barriers 79, and a third insulating layer is formed on the second insulating layer and the etch barriers 79. The second plurality of spacers 81 can be formed from a silicon nitride layer which is anisotropically etched, and the third insulating layer may be formed from silicon oxide.

Figure 9G:
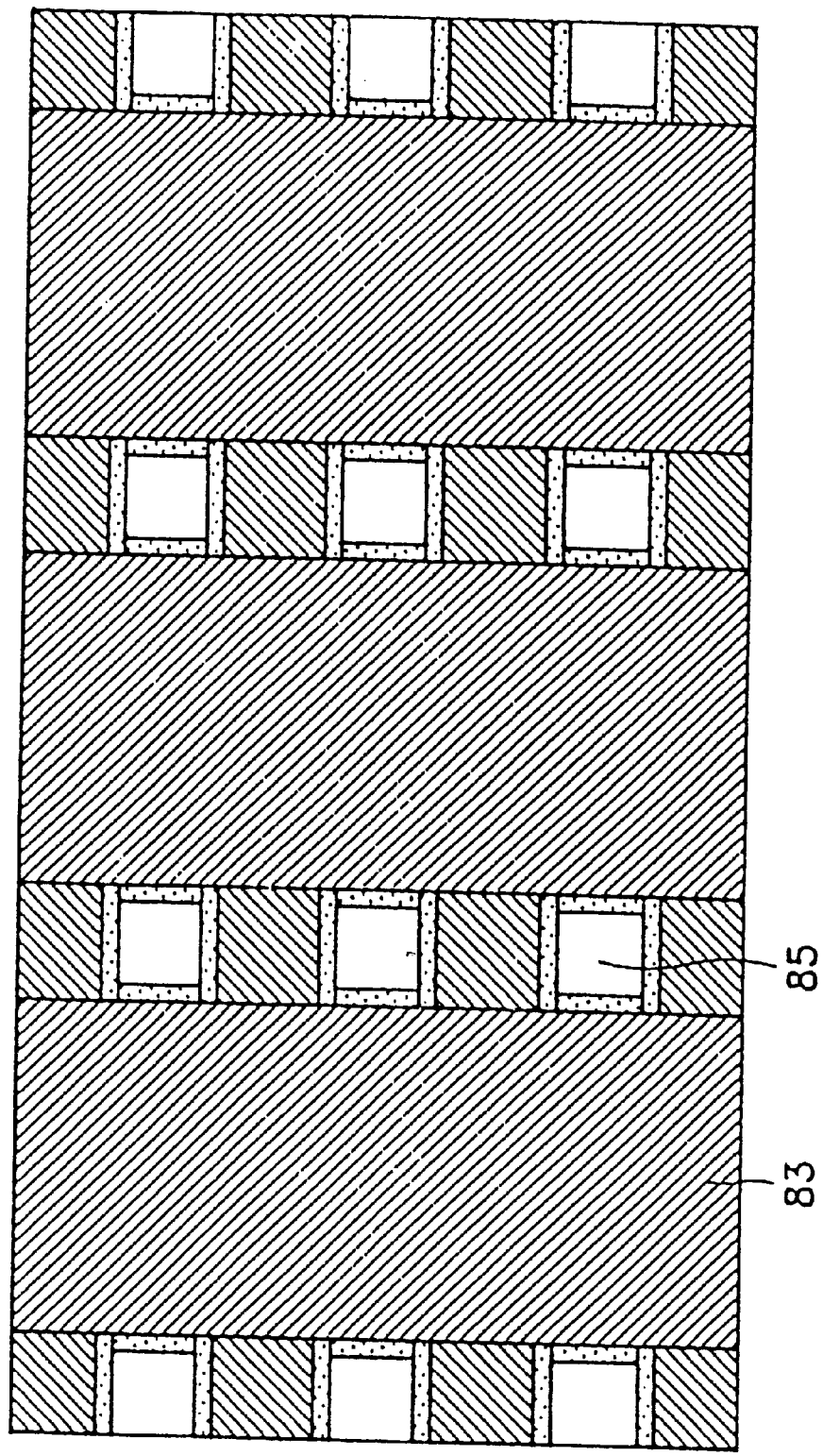

A photoresist pattern 83 can be formed on the third insulating layer as shown in FIG. 9G. This photoresist mask 83 exposes linear regions of the third insulating layer over the source regions of the transistors below. Contact holes 85 can then be formed by etching the exposed portions of the insulating layer. The insulating layer is initially masked by the photoresist mask 83. Once the portion of the insulating layer above the etch barrier is removed, the etch barrier serves a masking function. The photoresist layer 83 can then be removed and the integrated circuit memory device can be completed using conventional processing techniques. For example, conductive vias can be formed in the contact holes 85 and memory cell capacitors can be formed thereon.

In the method for fabricating an integrated circuit memory device discussed above, the photolithography process used to form contact holes exposing the source regions of the transistors can be performed with a greater tolerance for alignment errors than provided by methods of the prior art. In particular, the photoresist mask exposing linear portions of the insulating layer over the source regions can be more easily aligned than a photoresist mask exposing only the holes. Stated in other words, the linear mask pattern reduces the need for precise alignment along the linear direction because the sides of the contact hole in that dimension are defined by the etch barrier and spacers on the bit-lines.

The alignment in the direction perpendicular to the linear direction can be partially compensated for by the spacers adjacent the gate-lines. Accordingly, alignment tolerances are increased thus reducing failures due to misalignment. Furthermore, even if the aspect ratio of the buried contact hole is further increased, the method of the present invention allows the formation of the contact hole because the silicon oxide insulating layers can be selectively etched relative to the silicon and silicon nitride barrier layers and spacers.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit device comprising:
   a substrate;
   an insulating layer on said substrate;
   a plurality of parallel conductive lines on said insulating layer;
   an etch barrier on each of said parallel conductive lines wherein each of said etch barriers comprises a layer of silicon nitride on a respective conductive line and wherein each of said etch barriers further comprises a layer of silicon on said silicon nitride layer wherein said respective conductive line and said silicon nitride and silicon layers thereon define a mesa structure with mesa sidewalls including portions of said respective conductive line and said silicon nitride and silicon layers thereon;
   an insulating spacer along at least one of said mesa sidewalls including said portions of said respective conductive line and said silicon nitride and silicon layers thereon so that said insulating spacer is directly on said portions of each of said conductive line and said silicon nitride and silicon layers defining said mesa sidewalls with no intervening layers therebetween; and a plurality of conductive vias through said insulating layer providing electrical connection to respective surface portions of said substrate, wherein each of said conductive vias is provided in said insulating layer between said etch barriers.

2. An integrated circuit device according to claim 1 wherein said substrate includes a plurality of source and drain regions separated by channel regions, said integrated circuit device further comprising:

a plurality of parallel gate-lines on said substrate, wherein each of said gate-lines is adjacent at least one of said channel regions, wherein said plurality of gate-lines is orthogonal to said plurality of parallel conductive lines, and wherein said insulating layer separates said plurality of gate-lines and said substrate from said plurality of parallel conductive lines.

3. An integrated circuit device according to claim 2 wherein each of said conductive lines comprises a bit-line, said integrated circuit device further comprising:

a second plurality of conductive vias through said insulating layer wherein each of said conductive vias of said second plurality provides electrical connection between a respective bit-line and one of said drain regions.

4. An integrated circuit device according to claim 2 further comprising a plurality of gate spacers along sidewalls of said plurality of gate-lines.

5. An integrated circuit device according to claim 1 wherein said plurality of parallel conductive lines are formed from a material chosen from the group consisting of titanium, titanium nitride, and tungsten.

6. An integrated circuit device according to claim 1 wherein said insulating layer comprises a layer of silicon oxide.

7. An integrated circuit device comprising:

a substrate;

a plurality of first parallel conductive lines over the substrate, each of the plurality of first parallel conductive lines having a first etch barrier layer on top and side surfaces thereof;

a plurality of second parallel conductive lines over the plurality of first conductive lines, the plurality of second parallel conductive lines being orthogonal to the plurality of first parallel conductive lines, each of the plurality of second parallel conductive lines having a second etch barrier layer on top and side surfaces thereof, and the second barrier layer on the top surfaces of the plurality of second parallel conductive lines comprising a silicon layer and a silicon nitride layer wherein the silicon layer is on the silicon nitride layer;

an insulating layer interposed between the plurality of first parallel conductive lines and the plurality of second parallel conductive lines; and a plurality of conductive vias through the insulating layer, the plurality of conductive vias being self-aligned by the plurality of first parallel conductive lines and the plurality of second parallel conductive lines being orthogonal to the plurality of first parallel conductive lines such that the plurality of conductive vias are provided in the insulating layer between the first etch barrier layers and between the second etch barrier layers, and the plurality of conductive vias providing electrical connection to respective portions of the substrate.

8. An integrated circuit device according to claim 7 wherein each of said plurality of second parallel conductive lines comprises a bit-line, said integrated circuit device further comprising:

a second plurality of conductive vias providing electrical connection between a respective bit-line and said substrate.

9. An integrated circuit device according to claim 7 wherein said plurality of second parallel conductive lines are formed from a material chosen from the group consisting of titanium, titanium nitride, and tungsten.

10. An integrated circuit device according to claim 7 wherein said insulating layer comprises a layer of silicon oxide.

11. An integrated circuit device according to claim 7 wherein said plurality of second parallel conductive lines are not exposed to said conductive vias.

* * * * *

(Also Form PTO-1050)

UNITED STATES PATENT AND TRADEMARK OFFICE
CERTIFICATE OF CORRECTION

PATENT NO.    : 6,104,050
DATED         : August 15, 2000
INVENTOR(S)   : Do-hyung Kim, Joo-young Lee, Young-so Park It is certified that error appears in the above-identified patent and that said Letters Patent is hereby corrected as shown below:

Title Page, item [54] and col. 1, in the title should read as follows:
--INTEGRATED CIRCUIT STRUCTURES INCLUDING ETCHING BARRIER LAYERS--

Signed and Sealed this

Twenty-fourth Day of April, 2001

Attest:

NICHOLAS P. GODICI

*Attesting Officer*    Acting Director of the United States Patent and Trademark Office